(12) United States Patent
Ferriss et al.

(10) Patent No.: US 8,629,701 B2
(45) Date of Patent: Jan. 14, 2014

(54) PLL BANDWIDTH CORRECTION WITH OFFSET COMPENSATION

(71) Applicant: International Business Machines Corporation, Armonk, NY (US)

(72) Inventors: Mark A. Ferriss, Tarrytown, NY (US); Arun Natarajan, White Plains, NY (US); Benjamin Parker, Peekskill, NY (US); Alexander Rylyakov, Mount Kisco, NY (US); Jose A. Tierno, Palo Alto, CA (US); Soner Yaldiz, Pittsburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/947,664

(22) Filed: Jul. 22, 2013

(65) Prior Publication Data
US 2013/0307588 A1 Nov. 21, 2013

Related U.S. Application Data

(63) Continuation of application No. 13/230,371, filed on Sep. 12, 2011, now Pat. No. 8,493,113.

(51) Int. Cl.
*H03L 7/06* (2006.01)
(52) U.S. Cl.
USPC .......................................... 327/156; 327/147
(58) Field of Classification Search
USPC ................................................ 327/147, 156
See application file for complete search history.

(56) References Cited

U.S. PATENT DOCUMENTS

| | | | |
|---|---|---|---|
| 6,360,163 B1 * | 3/2002 | Cho et al. ....................... | 701/118 |
| 6,784,076 B2 | 8/2004 | Gonzalez et al. | |
| 7,092,856 B1 | 8/2006 | Hojo et al. | |
| 7,095,287 B2 | 8/2006 | Maxim et al. | |
| 7,102,401 B2 | 9/2006 | Galloway | |
| 7,403,073 B2 | 7/2008 | Kossel et al. | |
| 7,411,463 B2 | 8/2008 | Tanis | |
| 7,551,677 B2 | 6/2009 | Crawford | |
| 7,957,500 B2 * | 6/2011 | Sanduleanu et al. .......... | 375/374 |

(Continued)

OTHER PUBLICATIONS

Fischette, et al., "An Embedded All-Digital Circuit to Measure PLL Response", IEEE Journal of Solid-State Circuits, 45(8), pp. 1492-1503, Aug. 2010, DOI: 10.1109/JSSC.2010.2048143.

(Continued)

*Primary Examiner* — Adam Houston
(74) *Attorney, Agent, or Firm* — Scully, Scott, Murphy & Presser, P.C.; Ann Dougherty, Esq.

(57) ABSTRACT

A method and system for compensating for offsets when measuring parameters of a phase-locked loop (PLL). In one embodiment, a proportional path in the PLL is temporarily shut off, a measurement is made of a real time-to-zero crossing in the PLL to measure a defined parameter of the PLL, the proportional path is switched on, and the defined loop parameter is adjusted based on this measurement. In one embodiment, the real time-to-zero crossing is measured after introducing a phase step into the PLL between a reference signal and an output signal of the PLL. In an embodiment, two phase steps, having opposite polarities, are successively introduced into the PLL, and the time-to-crossing measurements resulting from these two phase steps may be averaged, and this average is used to determine a loop parameter.

20 Claims, 4 Drawing Sheets

(56) References Cited

U.S. PATENT DOCUMENTS

| | | | |
|---|---|---|---|
| 8,373,473 B2* | 2/2013 | Cheng et al. | 327/158 |
| 8,493,113 B2* | 7/2013 | Ferriss et al. | 327/156 |
| 2005/0062550 A1* | 3/2005 | Melanson | 331/17 |
| 2006/0290435 A1 | 12/2006 | Staszewski et al. | |
| 2008/0164918 A1 | 7/2008 | Stockstad et al. | |
| 2009/0174446 A1 | 7/2009 | Park | |
| 2012/0019294 A1* | 1/2012 | Cheng et al. | 327/157 |
| 2012/0213531 A1* | 8/2012 | Nazarathy et al. | 398/202 |
| 2013/0027096 A1* | 1/2013 | Pialis et al. | 327/156 |
| 2013/0027097 A1* | 1/2013 | Wang et al. | 327/156 |
| 2013/0027098 A1* | 1/2013 | Wang et al. | 327/156 |
| 2013/0027099 A1* | 1/2013 | Wang et al. | 327/156 |
| 2013/0027100 A1* | 1/2013 | Yaghini et al. | 327/156 |
| 2013/0063192 A1* | 3/2013 | Ferriss et al. | 327/157 |

OTHER PUBLICATIONS

Roche, et al., "50-MHz phase locked loop with adaptive bandwidth for jitter reduction", International Conference on Microelectronics, ICM 2007, pp. 291-294, DOI: 1109/ICM.2007.4497713.

* cited by examiner

PLL BANDWIDTH CORRECTION WITH OFFSET COMPENSATION

CROSS REFERENCE TO RELATED APPLICATION

This application is a continuation of copending U.S. patent application Ser. No. 13/230,371, filed Sep. 12, 2011, the entire content and disclosure of which is hereby incorporated herein by reference.

STATEMENT OF GOVERNMENT INTEREST

This invention was made with Government support under Contract No.: FA8650-090-C-7924 Defense Advanced Research Projects Agency (DARPA). The Government has certain rights in this invention.

BACKGROUND OF THE INVENTION

This invention generally relates to phase-locked loop frequency synthesizers, and more specifically, to measuring parameters of phase-locked loop frequency synthesizers.

Phase-locked loop frequency synthesizers, generally referred to as phase-locked loops or PLLs, are devices that generates an output signal with a frequency that is a function of a reference input signal. PLLs are used in many systems such as data processing systems, communication systems, and audio and video processing systems. When a PLL is implemented in a system, the frequency of the output signal of the PLL may change many times. For example, the frequency of this output signal may change at the start-up of the system, or when the system changes from one channel to another.

The PLL may include certain components connected in a feedback loop. For example, the components in a PLL may include a phase frequency detector (PFD), a charge pump (CP), a loop filter, and a voltage controlled oscillator (VCO). The PLL may additionally include a feedback frequency divider in applications where the VCO frequency is designed to be a multiple of the reference frequency.

In one example, the PFD can compare a reference signal provided by a suitable signal generator such as an oscillator to an output signal provided as feedback from the VCO. Based on these signals, the PFD can determine differences between the signals and express these differences as up or down pulses to the charge pump. The charge pump can then provide charge to the loop filter, which filters the charge pump output to the tuning port of the VCO. Upon receiving a signal from the charge pump via the loop filter, the VCO can generate an output signal having a frequency based on the voltage level of the input signal provided by the loop filter. Signals generated by the VCO can be fed back to the PFD to complete the feedback loop between the PFD, the charge pump, the loop filter and the VCO.

The absolute values of the operating parameters of the components that are part of a PLL often depend upon temperature and supply voltage. Furthermore, these values can also vary due to manufacturing tolerances. For instance, the time constants and settling behavior of a PLL are dependent on physical elements such as resistors and capacitors that may have a significant variation over process, temperature and supply voltage. In addition, in variable output frequency synthesizers, the natural frequency, loop bandwidth, and damping factor of the PLL are dependent on the feedback divider modulus as well as the frequency of operation.

Dynamic analysis of a control system is usually performed using the transfer function, which is a mathematical representation of the relationship between the input signal and the output signal of the system. The open loop phase domain transfer function of a PLL typically contains two integrators and a stabilizing zero. One of the integrators is a result of the phase relationship between the VCO input and output. The other integrator and the zero are contained in the loop filter.

The relationship between the phase of the input signal to the output signal of a type II PLL can be characterized with parameters: wn, $\zeta$ and N.

$$\frac{\theta_{out}}{\theta_{in}} = \frac{1}{N} \frac{2\zeta\omega_n s + \omega_n^2}{s^2 + 2\zeta\omega_n s + \omega_n^2} \qquad (1)$$

Where N is the division ration, where $\omega_n = \sqrt{K_d K_0 K_2}$ and $$\zeta = \frac{K_1}{2}\sqrt{\frac{K_d K_0}{K_2}}.$$

Where:
$K_1$=Gain through the proportional path.
$K_2$=Gain of the integral path.
$K_d$=Phase detector gain
$K_0$=The VCO gain In many systems, it is desirable to fix the location of the PLL's zeros and poles, in order to have a well known relationship between the phases of the input and output signals, and to control the PLL close to carrier phase noise. In a practical PLL, the locations of the poles and zeros are functions of the gains of the small signal components within the loop ($K_1$, $K_2$ and $K_0$). The gains of these components can vary significantly across process and operating conditions. For example, the VCO's voltage to frequency transfer function is nonlinear such that the small signal gain of the VCO at two frequencies within a few percent of each other can have a ratio of 3:1 or greater. Other loop parameters, such as the Charge pump gain and loop filter impedances, are also susceptible to random variation. The net result is that the dynamics of an un-calibrated PLL exhibit large amounts of variation.

There are two parts to calibration of the PLL dynamics; measuring the locations of the poles and zeros, and adjusting the positions of the poles and zeros. Adjusting the positions of the poles and zeros in a locked PLL is achieved by adjusting the size of the loop capacitor, resistor, and charge pump currents. The more challenging task is the measurement of the positions of the poles and zeros in the presences of offsets and nonlinearities, which are typically present in a PLL.

The prior art includes techniques for measuring a PLL's bandwidth by adding phase steps to the PLL, and measuring the time until the phase of the PLL crosses zero. The phase steps are added to the loop by changing the dividers count value by one, for one reference cycle. In the prior art, a digital "bang-bang" phase detector is placed in parallel with the PLL's phase detector. This digital phase detector detects which of the rising edges of the two input clocks arrives first. By measuring the time it takes for the output of the digital phase detector to change polarity, the time at which the phase of the PLL has crossed zero is measured.

There are several important practical details which will limit the effectiveness of prior art techniques. A practical PLL can have a phase offset at its input due to circuit non-idealities (charge pump current miss-match, capacitor leakage, etc). A crossover detection circuit (e.g. a bang-bang phase detector) will have additional offsets which are distinct from the PLL's offsets. A small offset can lead to a very large error in the time-to-crossover measurement, limiting the effectiveness of prior art.

The errors caused by offsets will be less significant if the magnitude of the phase step is increased. However, if the phase step is large, then the PLL non-linearities can also cause significant errors (e.g. the VCO control voltage moves to a different point on its nonlinear tuning curve, or the proportional path saturates).

BRIEF SUMMARY

Embodiments of the invention provide a method and system for compensating for offsets when measuring parameters of a phase-locked loop (PLL). In one embodiment, the method comprises temporarily shutting off a proportional path in the PLL, making a measurement of a real time-to-zero crossing in the PLL to measure a defined parameter of the PLL, switching on the proportional path, and adjusting the defined loop parameter based on said measurement.

In one embodiment, the measurement of the real time-to-zero crossing is made by introducing a phase step into the PLL between a reference signal and an output signal of the PLL, bringing the reference signal and the output signal into phase, and making a measurement of the time between when said phase step is introduced and the time when the reference signal and the output signal are brought into phase.

In an embodiment, a first phase step is introduced at a first time and second phase step is introduced at a second time, and these phase steps have opposite polarities. A first time-to-zero crossing measurement is made after said first phase step is introduced, and a second time-to-zero crossing measurement is made after said second phase step in introduced.

In one embodiment, the proportional path is shut off substantially at the same time that each of the first and second phase steps is introduced, and the proportional path is kept off while making the measurements of the first and second time-to-zero crossings.

In an embodiment, the steps of temporarily shutting off the proportional path, making a measurement of a real time-to-zero crossing in the PLL, and switching on the proportional path, are repeated a number of times. The PLL is adjusted to adjust the real time-to-crossing measurements until an average of a specified number of said real time-crossing measurements is equal to a given target value.

In one embodiment, each measurement of a real-time-to crossing is made after introducing a respective one phase step into the PLL between a reference signal and an output signal of the PLL, and successive phase steps have alternating polarities.

In an embodiment, the measurement of the real-time-to crossing may be used to calculate a natural frequency $\omega_n$ of the PLL.

In one embodiment, the invention provides a method and system for measuring one or more parameters of a phase-locked loop frequency synthesizer (PLL). The PLL comprises a loop filter, including a proportional path, for applying a filtered signal to a variable oscillator. In an embodiment, the method comprises introducing first and second phase steps, at first and second times respectively, into the PLL between an input signal to the PLL and an output signal of the PLL. Each of these first and second phase steps have opposite polarities. Each time one of the phase steps is introduced into the PLL, the proportional path of the loop filter is turned off, and a measurement is made of the length of time to eliminate a phase difference between the input and output signal of the PLL after said each phase difference is introduced into the PLL. This length of time measurements is used to determine a value for said one or more parameters.

In an embodiment, an average of the length of time measurements is used to determine the value for said one or more parameters.

In one embodiment, the proportional path is turned off substantially at the same time that each of the phase steps is introduced into the PLL. In an embodiment, the proportional path is turned on after each measurement is made.

In an embodiment, the length of time measurements are used to determine the natural frequency of the PLL. In one embodiment, $\omega_n$ in combination with a single length of time measurement is used to calculate intrinsic offsets in the PLL.

In an embodiment, the first phase step is introduced into the PLL in a first time period, and a first phase difference is produced between the input and output signals of the PLL, and the second phase step is introduced into the PLL in a second time period, and a second phase difference is produced between the input and output signals of the PLL. In one embodiment, in this first time period, the proportional path is turned off, and a first measurement is made of a time-to-crossover for said first phase difference to reach zero after said first phase step is introduced. In the second time period, the proportional path is turned off, and a second measurement is made of a time-to-crossover for said second phase difference to reach zero after the second phase step in introduced. These first and second measurement of the time-to-crossover are used to determine the value for said one or more parameters.

In embodiments of the invention, a PLL's natural frequency, wn, and damping coefficient, $\zeta$, can be accurately measured and controlled, even in the presence of PLL phase offsets. In embodiments of the invention, phase steps are added to a PLL, and the proportional and integral path gains are adjusted in such a way that the phase offset of the PLL can be measured and correct for.

In embodiments of the invention, a phase step is injected into a locked PLL while simultaneously temporarily switching off the proportional path current (which sets $\zeta$ to 0), and the time-to-crossover is measured. The procedure is done twice, with positive and negative phase steps. The average time-to-crossover in response to opposite polarity phase steps, and with $\zeta=0$, is not a function of the phase offset of the PLL, and is only a function of the integral path gain. Therefore the integral path gain can be adjusted until a target time-to-crossover is achieved, corresponding to a desired $\omega_n$.

Once $\omega_n$ of the PLL has been calibrated, the offset of the PLL can be measured by measuring the time-to-crossover of the PLL with $\zeta=0$ (without averaging the positive and negative phase step results). Once $\omega_n$ and the offset are known, the time to crossover with the proportional path turned on, (and with the known offset) is measured. The gain of the proportional path is adjusted unit the time-to-crossover reaches the required value for a given $\zeta$.

DETAILED DESCRIPTION

Figure 1:
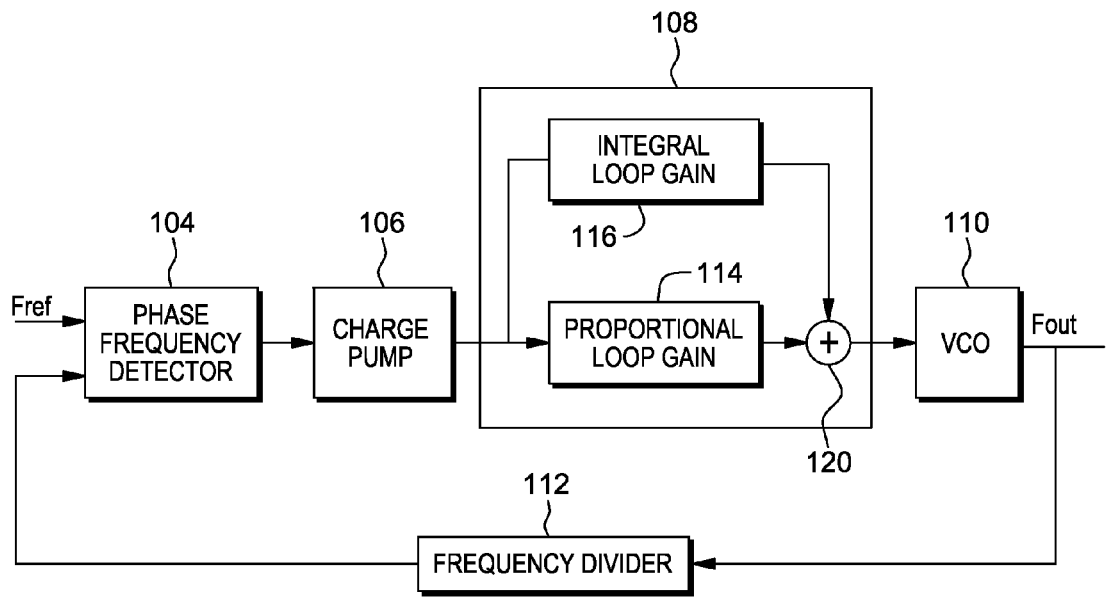
FIG. 1 is a diagram illustrating one configuration of a phase-locked loop (PLL) frequency synthesizer.
Figure 2:
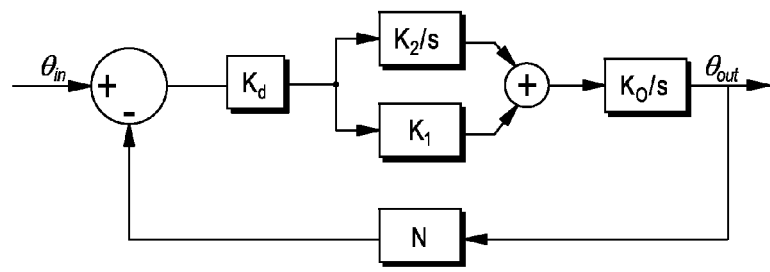
FIG. 2 shows a small signal model of a PLL.

FIG. 1 is a diagram of an example phase-locked loop (PLL) 100. Generally, in the operation of the PLL, a reference signal with a predetermined frequency is provided by a signal generator such as a crystal oscillator, and, from this reference signal, PLL 100 generates an output signal that is fixed, or locked, in frequency and/or phase to the reference signal. In one example, PLL generates the output signal using a phase frequency detector (PFD) 104, a charge pump (CP) 106, a loop filter 108, and a voltage controlled oscillator (VCO) 110 operating in a closed feedback loop. In the embodiment shown in FIG. 1, PLL 100 also includes N divider 112, and the loop filter 108 includes a proportional loop path 114 and an integral loop path 116.

In one example, PFD 104 can compare a reference signal provided by the signal generator to an output signal provided as feedback from VCO 110. Based on these signals, PFD 104 can determine differences in phase and/or frequency between the signals and express this difference as "pump up" or "pump down" pulses to charge pump 106. Charge pump 106 can then provide charge to the loop filter 108, which filters the charge pump output to the turning port of VCO 110. By way of specific example, PFD 104 can generate a digital output signal comprised of high and/or low pulses of varying lengths. Charge pump 106 can receive this signal and produce an output corresponding to the pump up and/or pump down signals from PFD 104. The charge pump 106 output can subsequently be filtered by loop filter 108 to provide a stable voltage level to VCO 110.

Upon receiving a signal from charge pump 106 via loop filter 108, VCO 110 can generate an output signal having a frequency based on the voltage level of the input signal provided by loop filter 108. As PLL 100 further illustrates, signals generated by VCO 110 can be fed back to PFD 104 to complete the feedback loop between PFD 104, charge pump 106, loop filter 108, and VCO 110. In one example, signals generated by VCO 110 can be compared to the reference signal to facilitate continuous adjustment of the output signal of PLL 100 in relation to the reference signal.

The loop filter 108 may include a proportional loop gain block 114 and an integral loop gain block 116. Blocks 114 and 116 may have a common input and may be combined together via a summing point 120. The proportional loop gain block 114 may have a gain of a that represents the amount of attenuation applied to the phase error prior to affecting the VCO frequency. Viewed in the frequency domain, a controls the fraction of the phase difference detected at the input of the PFD that is produced at an input to the DCO.

Dividers or counters can further be employed within PLL 100 to cause the PLL to generate an output signal having a frequency that is a specified multiple of the frequency of the reference signal provided by oscillator 102 and/or another suitable reference signal source. By utilizing dividers, signals of multiple frequencies can be generated by a PLL 100 based on a single reference signal. In one example, an N divider 112 can be applied to an output signal from VCO 110 prior to feeding the signal back to PFD 104 for comparison. In such an example, N divider 112 can be configured to generate a signal having a frequency equal to the frequency of the output signal of VCO 110 divided by an integer parameter N. By doing so, PLL 100 can be configured to generate a signal having a frequency equal to the reference frequency multiplied by N.

As mentioned above, the absolute values of the operating parameters of the components that are part of a PLL often depend upon temperature and supply voltage. Furthermore, these values can also vary due to manufacturing tolerances. For instance, the time constants and settling behavior of a PLL are dependent on physical elements such as resistors and capacitors that may have a significant variation over process, temperature and supply voltage. In addition, in variable output frequency synthesizers, the natural frequency, loop bandwidth, and damping factor of the PLL are dependent on the feedback divider modulus as well as the frequency of operation.

Dynamic analysis of a control system is usually performed using the transfer function, which is a mathematical representation of the relationship between the input signal and the output signal of the system.

There are two parts to calibration of the PLL dynamics; measuring the locations of the poles and zeros, and adjusting the positions of the poles and zeros. Adjusting the positions of the poles and zeros in a locked PLL is achieved by adjusting the size of the loop capacitor, resistor, and charge pump currents. The more challenging task is the measurement of the positions of the poles and zeros in the presences of offsets and nonlinearities, which are typically present in a PLL.

Figure 3:
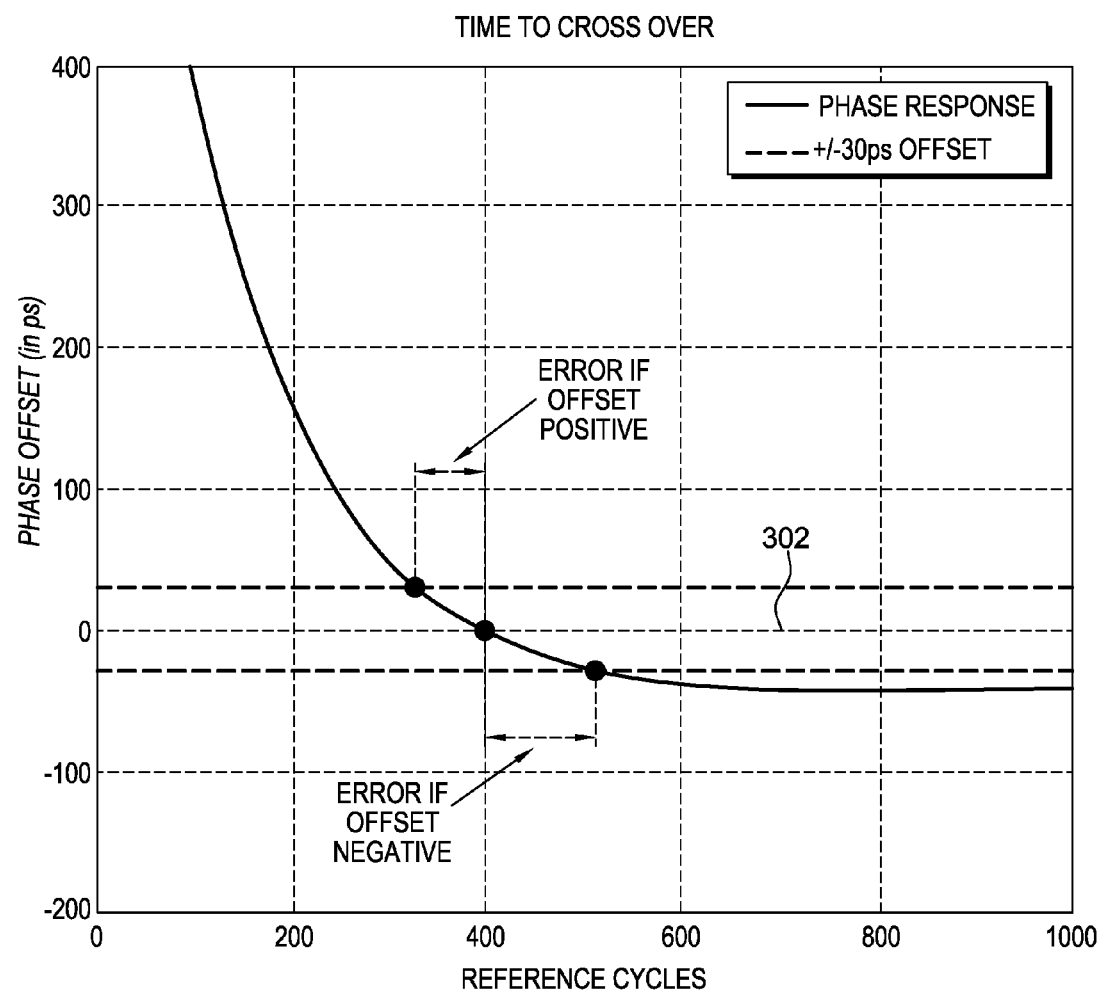
FIG. 3 is a graph showing the phase difference at the input of a PLL after a phase step.
Figure 4A:
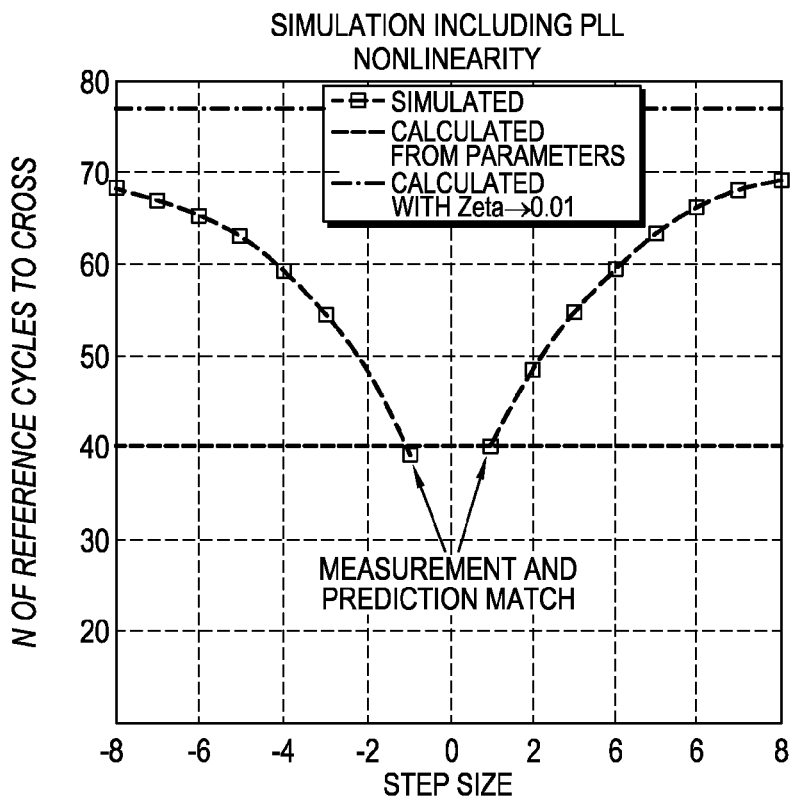
FIG. 4(a) shows the simulated time in reference cycles until a crossover (y-axis) versus the size of an injected step phase (x-axis), where the simulation models just PLL non-linearities.
Figure 4B:
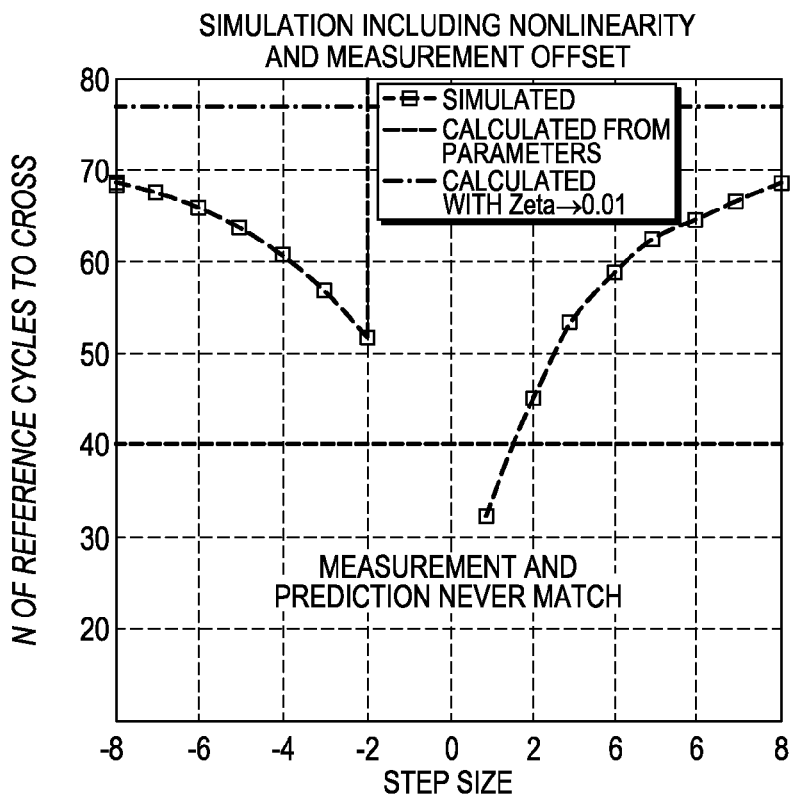
FIG. 4(b) shows the simulated time until a cross over occurs versus the size of an injected phase step, where the simulation models PLL non-linearities and offsets.

The prior art includes techniques for measuring a PLL's bandwidth by adding phase steps to the PLL and measuring the time until the phase of the PLL crosses zero. There are several important practical details which will limit the effectiveness of prior art techniques. A practical PLL can have a phase offset at its input due to circuit non-idealities (charge pump current miss-match, capacitor leakage, etc). A crossover detection circuit (e.g. a bang-bang phase detector) will have additional offsets which are distinct from the PLL's offsets. FIG. 3 shows the phase at the PLL's input after a phase step (as part of time-to-crossover measurement). A small offset (30 ps in FIG. 3) can lead to a very large error in the time-to crossover measurement, limiting the effectiveness of prior art.

The errors caused by offsets will be less significant if the magnitude of the phase step is increased. However, if the phase step is large, then the PLL non-linearities can also cause significant errors (e.g. the VCO control voltage moves to a different point on its non-linear tuning curve, or the proportional path saturates). FIGS. 3(a) and 3(b) show the simulated effects on crossover time if FIG. 3(a) the PLL's non-linearity is modeled and FIG. 3(b) there are both non-linearity and offsets. On the z-axis is the magnitude of the phase step added, normalized to the output period. On y-axis is the time in references period for the PLL to re-cross zero after a phase step is added. The dotted line 302 corresponds to the time to crossover in the ideal linear, offset free measurement. If there are non-linearities in the system, then the measurement is corrupted for large phase steps; if there are offsets then the measurements are corrupted for small steps.

Embodiments of the invention provide a method and system in which a PLL's natural frequency, wn, and damping coefficient, ζ. cam be accurately measured and controlled, even in the presence of PLL phase offsets.

In embodiments of the invention, a phase step is injected into a locked PLL while simultaneously temporarily switching off the proportional path current (which sets ζ to 0), and the time-to-crossover is measured. The procedure is done twice, with positive and negative phase steps. The average time-to-crossover in response to opposite polarity phase steps, and with ζ=0 is not a function of the phase offset of the PLL, and is only a function of the integral path gain. Therefore the integral path gain can be adjusted until a target time-to-crossover is achieved, corresponding to a desired $\omega_n$.

Once $\omega_n$ and the offset are known, the time to crossover with the proportional path turned on, (and with the known offset) is measured. The gain of the proportional path is adjusted unit the time-to-crossover reaches the required value for a given ζ. In embodiments of the invention, phase steps are added to a PLL, and the proportional and integral path gains are adjusted in such a way that the phase offset of the PLL can be measured and correct for.

If a phase step is added to an over damped type II PLL, then the resulting transient is given by:

$$\phi_{err}(t) = \phi_{step} e^{-\zeta \omega_n t}\left[\cosh\left(\omega_n t \sqrt{\zeta^2-1}\right) - \frac{\zeta}{\sqrt{\zeta^2-1}}\sinh\left(\omega_n t \sqrt{\zeta_2-1}\right)\right] \quad (2)$$

Time unit the phase re-crosses zero, $\tau_{crossover}$, is give by:

$$\tau_{crossover} = \frac{1}{\omega_n \sqrt{\zeta^2-1}} \operatorname{arctanh}\left(\frac{\sqrt{\zeta^2-1}}{\zeta}\right) \quad (3)$$

From (3), the time-to-crossover is a function of $\omega_n$ and ζ. In addition, if the PLL has an offset, then equation (3) is no longer valid.

The time until the first cross over if ζ=0, is given by the first solution to:

$$\tau_{+/-} = \frac{1}{\omega_n} \cos^{-1}\left(\frac{+/- \theta_{offset}}{\theta_{step}}\right) \quad (4)$$

Where $\tau_{+/-}$ refers to the time-to-crossover with a positive/negative phase step. Swapping the polarity of the phase step is equivalent to swapping the polarity of the offset. When $\theta_{offset} << \theta_{step}$, and the first solution to (4) is considered (first time-to-crossover), it can be shown that:

$$\frac{\tau_+ + \tau_-}{2} = \frac{1}{\omega_n}. \quad (5)$$

Thus, the average time-to-crossover measurement with opposite polarity pulses and with ζ=0 is only a function of $\omega_n$.

For a stable PLL, ζ is typically set to be greater than 1. If the ζ is close to zero, then the PLL is on the edge of instability. This is not a desirable state to be in, in a practical application. However, ζ can be temporarily set to zero by turning off the proportional path. Provided that the proportional path is turned off for less than the natural period of the PLL ($2\pi/\omega_n$) then the PLL will not oscillate.

The following algorithm can be used to measure the values of $\omega_n$, ζ and the PLL's phase offset $\Phi_{offset}$.

Step 1: The PLL is allowed to lock with the integral path and proportional path gains set to a default value.

Step 2: A phase step is introduced into the PLL by changing the count value within the programmable divider. Simultaneous to this, the proportional path is turned off (equivalent to setting ζ=0). The time-to-crossover is measured.

Step 3: The proportional path is turned on, and the PLL is allowed to lock. The same procedure as in Step 2 is performed, however, with the phase step having the opposite polarity.

Step 4: The average time until crossover is calculated. (Results from Step 2, 3). The average time-to-crossover is compared too a target value, and the integral path gain is increased/decreased if the average time-to-crossover is to large/small. Steps 2 through 4 are repeated until the target value is achieved. From equation (5), the correct value of the $\omega_n$ has been achieved. Also, with $\omega_n$ known, the size of the offset can be calculated from equation (4).

Step 5: the proportional path is turned on, and the time-to-crossover is measured again. With $\omega_n$, and the offset known, the only parameter left to fix is the proportional path gain (which will set ζ). For a known $\omega_n$ and offset, a target time-to-crossover number is calculated for a given ζ. The gain of the proportional path is incremented/decremented if the result of the time-to-crossover measurement is too slow/fast. This step is repeated until the time-to-crossover reaches a target value.

Figure 5A:
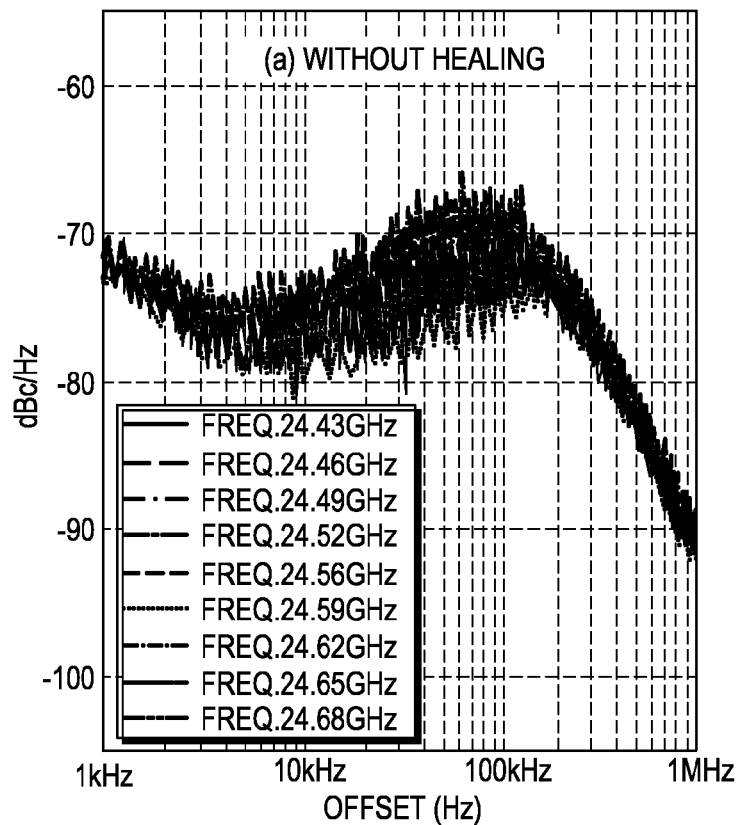
FIG. 5(a) illustrates in band phase noise of a PLL without use of this invention.
Figure 5B:
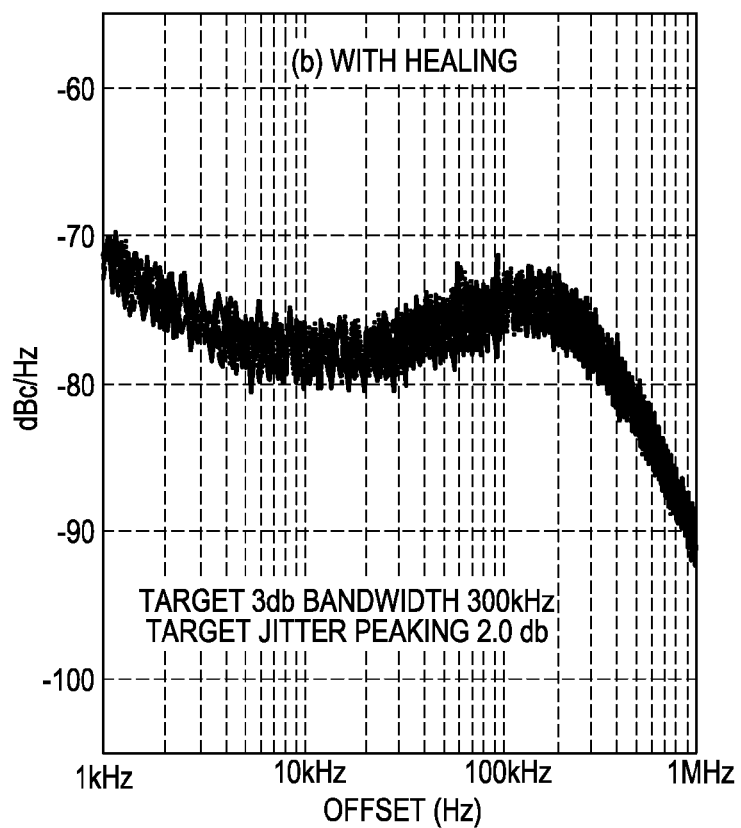
FIG. 5(b) shows in band phase noise of PLL with use of an embodiment of this invention.

Improved results achieved by using embodiments of the invention can be seen by comparing FIGS. 5(*a*) and 5(*b*). FIG. 5(*a*) shows in band phase noise of the PLL without use of this invention, and FIG. 5(*b*) illustrates in band phase noise of the PLL with use of an embodiment of the invention.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. A method of measuring a real time-to-zero crossing in a phase-locked loop (PLL), the method comprising:
   shutting off a proportional path in the PLL;
   introducing a phase step between a reference signal and an output signal of the PLL;
   bringing the reference signal and the output signal into phase; and
   making a measurement of a time between when said phase step is introduced and the time when the reference signal and the output signal are brought into phase to measure a real time-to-zero crossing in the PLL to measure a defined parameter of the PLL.

2. The method according to claim 1, wherein:
   the introducing a phase step includes introducing a first phase step at a first time and second phase step at a second time, said first phase step having a first polarity, and said second phase step having a second polarity, opposite said first polarity.

3. The method according to claim 2, wherein:
   the making a measurement includes measuring a first time-to-zero crossing after said first phase step is introduced, and measuring a second time-to-zero crossing after said second phase step in introduced.

4. The method according to claim 3, wherein the shutting off the proportional path includes:

shutting off the proportional path substantially at the same time that each of the first and second phase steps is introduced.

5. The method according to claim 4, wherein the shutting off the proportional path further includes:
keeping the proportional path shut off while making said measurements of the first and second time-to-zero crossings.

6. The method according to claim 1, further comprising:
repeating, for a number of times, the shutting off the proportional path, and the making a measurement of a time between when said phase step is introduced and the time when the reference signal and the output signal are brought into phase; and
switching on the proportional path after each of said measurements is made.

7. The method according to claim 6, further comprising:
adjusting the PLL to adjust said real time-to-crossing measurements until an average of a specified number of said real time-crossing measurements is equal to a given target value.

8. The method according to claim 7, wherein the repeating includes:
each time the step of making a measurement of a real-time-to crossing measurement is repeated, introducing a respective one phase step into the PLL between a reference signal and an output signal of the PLL, wherein each phase step has a polarity.

9. The method according to claim 8, wherein the repeating further includes:
alternating the polarities of successive phase steps introduced into the PLL.

10. The method according to claim 1, comprising further:
using said measurement to calculate a natural frequency $\omega_n$ of the PLL.

11. A phase-locked loop frequency synthesizer (PLL) system, comprising:
a phase frequency detector, a charge pump, a loop filter, and a variable frequency oscillator, connected together in a closed loop;
wherein the variable frequency oscillator generates an output signal, the phase frequency detector receives a reference signal and a portion of the output signal of the variable frequency oscillator, and the phase frequency detector determines differences between said reference signal and said output signal and operates the charge pump to adjust a control signal for the variable frequency oscillator, the loop filter filters said control signal and applies a filtered control signal to the variable frequency oscillator to adjust the output signal thereof: and the PLL system further comprises
a measuring subsystem for measuring a real time-to-zero crossing in the PLL, the measuring subsystem:
shutting off a proportional path in the loop filter of the PLL;
introducing a phase step between a reference signal and an output signal of the PLL;
bringing the reference signal and the output signal into phase; and
making a measurement of a time between when said phase step is introduced and the time when the reference signal and the output signal are brought into phase to measure a real time-to-zero crossing in the PLL to measure a defined parameter of the PLL.

12. The PLL system according to claim 11, wherein:
the introducing a phase step includes introducing a first phase step at a first time and second phase step at a second time, said first phase step having a first polarity, and said second phase step having a second polarity, opposite said first polarity.

13. The PLL system according to claim 12, wherein:
the making a measurement includes measuring a first time-to-zero crossing after said first phase step is introduced, and measuring a second time-to-zero crossing after said second phase step in introduced.

14. The PLL system according to claim 13, wherein the shutting off the proportional path includes:
shutting off the proportional path substantially at the same time that each of the first and second phase steps is introduced.

15. The PLL system according to claim 14, wherein the shutting off the proportional path further includes:
keeping the proportional path shut off while making said measurements of the first and second time-to-zero crossings.

16. The PLL system according to claim 11, wherein the measuring subsystem:
repeating, for a number of times, the shutting off the proportional path, and the making a measurement of a time between when said phase step is introduced and the time when the reference signal and the output signal are brought into phase; and
switching on the proportional path after each of said measurements is made.

17. The PLL system according to claim 16, wherein the measuring subsystem:
adjusting the PLL to adjust said real time-to-crossing measurements until an average of a specified number of said real time-crossing measurements is equal to a given target value.

18. The method according to claim 17, wherein the repeating includes:
each time the step of making a measurement of a real-time-to crossing measurement is repeated, introducing a respective one phase step into the PLL between a reference signal and an output signal of the PLL, wherein each phase step has a polarity.

19. The PLL system according to claim 18, wherein the repeating further includes:
alternating the polarities of successive phase steps introduced into the PLL.

20. The PLL system according to claim 11, wherein the measuring subsystem:
using said measurement to calculate a natural frequency $\omega_n$ of the PLL.

* * * * *